(12) United States Patent
Robinson

(10) Patent No.: US 10,618,080 B2
(45) Date of Patent: Apr. 14, 2020

(54) DEBRIS REMOVAL FROM HIGH ASPECT STRUCTURES

(71) Applicant: RAVE, LLC, Delray Beach, FL (US)

(72) Inventor: Tod Robinson, Boynton Beach, FL (US)

(73) Assignee: Bruker Nano, Inc., Delray Beach, FL (US)

( * ) Notice: Subject to any disclaimer, the term of this patent is extended or adjusted under 35 U.S.C. 154(b) by 0 days.

(21) Appl. No.: 15/011,411

(22) Filed: Jan. 29, 2016

(65) Prior Publication Data

US 2016/0158807 A1 Jun. 9, 2016

Related U.S. Application Data

(60) Continuation-in-part of application No. 14/193,725, filed on Feb. 28, 2014, now abandoned, which is a division of application No. 13/652,114, filed on Oct. 15, 2012, now Pat. No. 8,696,818, which is a
(Continued)

(51) Int. Cl.
| | |
|---|---|
| *B08B 1/00* | (2006.01) |
| *B03C 7/00* | (2006.01) |
| *B82Y 30/00* | (2011.01) |
| *B08B 7/00* | (2006.01) |
| *G03F 7/20* | (2006.01) |
| *G03F 1/82* | (2012.01) |

(52) U.S. Cl.
CPC ............. *B08B 1/001* (2013.01); *B03C 7/006* (2013.01); *B08B 1/00* (2013.01); *B08B 7/0028* (2013.01); *B82Y 30/00* (2013.01); *G03F 1/82* (2013.01); *G03F 7/70925* (2013.01)

(58) Field of Classification Search
CPC ..... B08B 7/0028; B08B 1/00; G03F 7/70925; B03C 7/006
See application file for complete search history.

(56) References Cited

U.S. PATENT DOCUMENTS

| | | | |
|---|---|---|---|
| 5,047,649 A | * | 9/1991 | Hodgson ................. B41M 5/20 250/307 |
| 5,102,768 A | | 4/1992 | Light et al. |
| 5,220,279 A | | 6/1993 | Nagasawa |

(Continued)

FOREIGN PATENT DOCUMENTS

| | | |
|---|---|---|
| CN | 1733596 | 2/2006 |
| CN | 1733596 A | 2/2006 |

(Continued)

OTHER PUBLICATIONS

"Cleaning Stick," IBM Technical Disclosure Bulletin, Dec. 1987, vol. 30; No. 7, 1 page.
(Continued)

*Primary Examiner* — Alexander Markoff
(74) *Attorney, Agent, or Firm* — BakerHostetler

(57) ABSTRACT

A system for removing debris from a surface of a substrate, the system including a cantilever arm and a tip supported by the cantilever arm. The tip has a proximal portion and a distal portion such that the tip is supported by the cantilever arm via the proximal portion. The system further includes at least one nanofibril attached to the distal portion of the tip, and the at least one nanofibril is configured to elastically deform against or around the debris or the surface of the substrate.

19 Claims, 9 Drawing Sheets

Related U.S. Application Data continuation of application No. 11/898,836, filed on Sep. 17, 2007, now Pat. No. 8,287,653.

(56) References Cited

U.S. PATENT DOCUMENTS

| | | | |
|---|---|---|---|
| 5,478,698 A * | 12/1995 | Rostoker | B82Y 10/00 250/492.2 |
| 5,553,486 A * | 9/1996 | Bonin | B82Y 35/00 361/283.1 |
| 5,634,230 A | 6/1997 | Maurer | |
| 5,652,428 A * | 7/1997 | Nishioka | B82Y 35/00 250/306 |
| 5,824,470 A * | 10/1998 | Baldeschwieler | B82Y 35/00 204/157.45 |
| 5,935,339 A | 8/1999 | Henderson et al. | |
| 6,056,627 A | 5/2000 | Mizuta | |
| 6,130,104 A | 10/2000 | Yamasaka | |
| 6,175,984 B1 | 1/2001 | Prime et al. | |
| 6,263,176 B1 | 7/2001 | An et al. | |
| 6,353,221 B1 | 3/2002 | Elings | |
| 6,817,052 B2 | 11/2004 | Grube | |
| 6,840,374 B2 | 1/2005 | Khandros et al. | |
| 6,861,648 B2 | 3/2005 | Kley | |
| 6,896,741 B2 | 5/2005 | Stelcher | |
| 6,908,364 B2 | 6/2005 | Back et al. | |
| 7,544,938 B1 * | 6/2009 | Stewart | B82Y 15/00 250/306 |
| 8,002,899 B2 | 8/2011 | Wu et al. | |
| 8,287,653 B2 | 10/2012 | Robinson et al. | |
| 2002/0117611 A1 | 8/2002 | Kley | |
| 2003/0092365 A1 | 5/2003 | Grube | |
| 2005/0099895 A1 | 5/2005 | Maeda et al. | |
| 2005/0151385 A1 | 7/2005 | Autumn et al. | |
| 2005/0172703 A1 | 8/2005 | Kley | |
| 2005/0184746 A1 | 8/2005 | Altmann et al. | |
| 2005/0208304 A1 * | 9/2005 | Collier | B01J 23/745 428/403 |
| 2005/0242072 A1 | 11/2005 | Van Den Oetelaar | |
| 2005/0255796 A1 | 11/2005 | Haga | |
| 2005/0266586 A1 | 12/2005 | Linder et al. | |
| 2006/0001438 A1 | 1/2006 | Humphrey et al. | |
| 2006/0211252 A1 | 9/2006 | Hopkins et al. | |
| 2006/0270221 A1 | 11/2006 | Tran et al. | |
| 2006/0270231 A1 | 11/2006 | Tran et al. | |
| 2007/0035724 A1 * | 2/2007 | Banin | G01N 21/6428 356/236 |
| 2007/0145966 A1 | 6/2007 | Shekhawat et al. | |
| 2008/0169003 A1 | 7/2008 | Curtis | |
| 2009/0071506 A1 | 3/2009 | Robinson et al. | |
| 2009/0093659 A1 | 4/2009 | Freitas et al. | |
| 2009/0241274 A1 | 10/2009 | Chun | |
| 2010/0055349 A1 | 3/2010 | Gaitas et al. | |
| 2010/0083985 A1 | 4/2010 | Numanami | |
| 2012/0080596 A1 | 4/2012 | Vandervorst | |
| 2013/0094020 A1 | 4/2013 | Li | |
| 2014/0004345 A1 | 1/2014 | Chasiotis et al. | |
| 2014/0176922 A1 | 6/2014 | Robinson et al. | |

FOREIGN PATENT DOCUMENTS

| | | |
|---|---|---|
| JP | 09-260326 | 10/1997 |
| JP | 09260326 A | 10/1997 |
| JP | 2003167003 | 6/2003 |
| JP | 2003167003 A | 6/2003 |
| JP | 2006184081 | 7/2006 |
| JP | 2006184081 A | 7/2006 |
| JP | 2008209544 A | 9/2008 |
| JP | 2009006378 A | 1/2009 |
| WO | 2004/052489 A2 | 6/2004 |
| WO | 2015/128804 A1 | 9/2015 |

OTHER PUBLICATIONS

Zhang, et al., "Cellulose Nanofibrils: From Strong Materials to Bioactive Surfaces," J. Renew Mater; vol. 1, No. 3, Jul. 2013; pp. 195-211.

EP Patent Application No. 08 83 2334 Supplemental European Search Report, dated Apr. 9, 2014.

Search Report cited on Oct. 28, 2013 in Taiwan Patent Application No. 097135684, filed Sep. 17, 2008.

EP Patent Application No. 08 83 2334 Supplemental European Search Report Reported dated Apr. 9, 2014.

International Preliminary Report on Patentability and Written Opinion issued in PCT/US2017/015062, dated Aug. 9, 2018.

Translation of Description of JP 2008-209544 (Year: 2008) [Cited in related U.S. Appl. No. 15/160,263].

* cited by examiner

DEBRIS REMOVAL FROM HIGH ASPECT STRUCTURES

CROSS-REFERENCE TO RELATED APPLICATIONS

This patent application is a continuation-in-part application and claims the priority benefit of co-pending U.S. patent application Ser. No. 14/193,725 filed on Feb. 28, 2014, which is a divisional of U.S. patent application Ser. No. 13/652,114 filed on Oct. 15, 2012 (issued as U.S. Pat. No. 8,696,818), which is a continuation of U.S. patent application Ser. No. 11/898,836 filed on Sep. 17, 2007 (issued as U.S. Pat. No. 8,287,653), all of which are incorporated herein by reference in their entirety.

TECHNICAL FIELD

The present disclosure relates generally to nanomachining processes. More particularly, the present disclosure relates to debris removal during and/or after to nanomachining processes. In addition, the debris removal processes of the present disclosure can be applied to removal of anything foreign to a substrate.

BACKGROUND

Nanomachining, by definition, involves mechanically removing nanometer-scaled volumes of material from, for example, a photolithography mask, a semiconductor substrate/wafer, or any surface on which scanning probe microscopy (SPM) can be performed. For the purposes of this discussion, "substrate" will refer to any object upon which nanomachining may be performed.

Examples of photolithography masks include: standard photomasks (193 nm wavelength, with or without immersion), next generation lithography mask (imprint, directed self-assembly, etc.), extreme ultraviolet lithography photomasks (EUV or EUVL), and any other viable or useful mask technology. Examples of other surfaces which are considered substrates are membranes, pellicle films, micro-electronic/nano-electronic mechanical systems MEMS/NEMS. Use of the terms, "mask" or, "substrate" in the present disclosure include the above examples, although it will be appreciated by one skilled in the art that other photomasks or surfaces may also be applicable.

Nanomachining in the related art may be performed by applying forces to a surface of a substrate with a tip (e.g., a diamond cutting bit) that is positioned on a cantilever arm of an atomic force microscope (AFM). More specifically, the tip may first be inserted into the surface of the substrate, and then the tip may be dragged through the substrate in a plane that is parallel to the surface (i.e., the xy-plane). This results in displacement and/or removal of material from the substrate as the tip is dragged along.

As a result of this nanomachining, debris (which includes anything foreign to the substrate surface) is generated on the substrate. More specifically, small particles may form during the nanomachining process as material is removed from the substrate. These particles, in some instances, remain on the substrate once the nanomachining process is complete. Such particles are often found, for example, in trenches and/or cavities present on the substrate.

In order to remove debris, particles or anything foreign to the substrate, particularly in high-aspect photolithography mask structures and electronic circuitry; wet cleaning techniques have been used. More specifically, the use of chemicals in a liquid state and/or agitation of the overall mask or circuitry may be employed. However, both chemical methods and agitation methods such as, for example, megasonic agitation, can adversely alter or destroy both high-aspect ratio structures and mask optical proximity correction features (i.e., features that are generally so small that these features do not image, but rather form diffraction patterns that are used beneficially by mask designers to form patterns).

In order to better understand why high-aspect shapes and structures are particularly susceptible to being destroyed by chemicals and agitation; one has to recall that such shapes and structures, by definition, include large amounts of surface area and are therefore very thermodynamically unstable. As such, these shapes and structures are highly susceptible to delamination and/or other forms of destruction when chemical and/or mechanical energy is applied.

It is important to note that in imprint lithography and EUV (or EUVL) that use of a pellicle to keep particles off the lithographic surface being copied is currently not feasible. Technologies that cannot use pellicles are generally more susceptible to failure by particle contamination which blocks the ability to transfer the pattern to the wafer. Pellicles are in development for EUV masks, but as prior experience with DUV pellicle masks indicates, the use of a pellicle only mitigates (but does not entirely prevent) critical particle and other contaminates from falling on the surface and any subsequent exposure to the high-energy photons will tend to fix these particles to the mask surface with a greater degree of adhesion. In addition, these technologies may be implemented with smaller feature sizes (1 to 300 nm), making them more susceptible to damage during standard wet clean practices which may typically be used. In the specific case of EUV or EUVL, the technology may require the substrate be in a vacuum environment during use and likely during storage awaiting use. In order to use standard wet clean technologies, this vacuum would have to be broken which could easily lead to further particle contamination.

Other currently available methods for removing debris from a substrate make use of cryogenic cleaning systems and techniques. For example, the substrate containing the high-aspect shapes and/or structures may be effectively "sandblasted" using carbon dioxide particles instead of sand.

However, even cryogenic cleaning systems and processes in the related art are also known to adversely alter or destroy high-aspect features. In addition, cryogenic cleaning processes affect a relatively large area of a substrate (e.g., treated areas may be approximately 10 millimeters across or more in order to clean debris with dimensions on the order of nanometers). As a result, areas of the substrate that may not need to have debris removed therefrom are nonetheless exposed to the cryogenic cleaning process and to the potential structure-destroying energies associated therewith. It is noted that there are numerous physical differences between nano and micro regimes, for the purposes here, the focus will be on the differences related to nanoparticle cleaning processes. There are many similarities between nano and macro scale cleaning processes, but there are also many critical differences. For the purposes of this disclosure, the common definition of the nanoscale is of use: this defines a size range of 1 to 100 nm. This is a generalized range since many of processes reviewed here may occur below this range (into atomic scales) and be able to affect particles larger than this range (into the micro regime).

Some physical differences between macro and nano particle cleaning processes include transport related properties including: surface area, mean free path, thermal, and field-effects. The first two in this list are more relevant to the thermo-mechanical-chemical behavior of particles while the last one is more concerned with particle interactions with electromagnetic fields. Thermal transport phenomenon intersects both of these regimes in that it is also the thermo-mechanical physical chemistry around particles and the interaction of particles with electromagnetic fields in the infrared wavelength regime. To functionally demonstrate some of these differences, a thought experiment example of a nanoparticle trapped at the bottom of a high aspect line and space structure (70 nm deep and 40 nm wide~AR=1.75) is posited. In order to clean this particle with macroscale processes, the energy required to remove the particle is approximately the same as the energy required to damage features or patterns on the substrate, thereby making it impossible to clean the high aspect line and space structure without damage. For macro-scale cleaning processes (Aqueous, Surfactant, Sonic Agitation, etc.), at the energy level where the nanoparticle is removed, the surrounding feature or pattern is also damaged. If one has the technical capability to manipulate nano-sharp (or nanoscale) structures accurately within nano-distances to the nanoparticle, then one may apply the energy to clean the nanoparticle to the nanoparticle only. For nanoscale cleaning processes, the energy required to remove the nanoparticle is applied only to the nanoparticle and not the surrounding features or patterns on the substrate.

First, looking at the surface area properties of particles, there are mathematical scaling differences which are obvious as a theoretical particle (modelled here as a perfect sphere) approaches the nanoscale regime. The bulk properties of materials are gauged with the volume of materials while the surface is gauged by the external area. For a hypothetical particle, its volume decreases inversely by the cube ($3^{rd}$ power) while the surface area decreases by the square with respect to the particle's diameter. This difference means that material properties which dominate the behavior of a particle at macro, and even micro, scale diameters become negligible into the nano regime (and smaller). Examples of these properties include mass and inertial properties of the particle, which is a critical consideration for some cleaning techniques such as sonic agitation or laser shock.

The next transport property examined here is the mean free path. For macro to micro regimes, fluids (in both liquid, gaseous, and mixed states) can be accurately modelled in their behavior as continuum flow. When considering surfaces, such as the surface of an AFM tip and a nanoparticle, that are separated by gaps on the nanoscale or smaller, these fluids can't be considered continuum. This means that fluids do not move according to classical flow models, but can be more accurately related to the ballistic atomic motion of a rarefied gas or even a vacuum. For an average atom or molecule (approximately 0.3 nm in diameter) in a gas at standard temperature and pressure, the calculated mean free path (i.e., distance in which a molecule will travel in a straight line before it will on average impact another atom or molecule) is approximately 94 nm, which is a large distance for an AFM scanning probe. Since fluids are much denser than gasses, they will have much smaller mean free paths, but it must be noted that the mean free path for any fluid can't be less than the atom or molecule's diameter. If we compare the assumed atom or molecule diameter of 0.3 nm given above to the typical tip to surface mean separation distance during non-contact scanning mode which can be as small as 1 nm, thus except for the most dense fluids, the fluid environment between an AFM tip apex and the surface being scanned will behave in a range of fluid properties from rarefied gas to near-vacuum. The observations in the prior review are crucial to demonstrating that thermo-fluid processes behave in fundamentally different ways when scaled from the macro to nano scale. This affects the mechanisms and kinetics of various process aspects such as chemical reactions, removal of products such as loose particles to the environment, charging or charge neutralization, and the transport of heat or thermal energy.

The known thermal transport differences from macro and nano to sub-nano scales has been found by studies using scanning thermal probe microscopy. One early difference seen is that the transport rate of thermal energy can be an order of magnitude less across nanoscale distances than the macro scale. This is how scanning thermal probe microscopy can work with a nano probe heated to a temperature difference of sometimes hundreds of degrees with respect to a surface it is scanning in non-contact mode with tip to surface separations as small as the nano or Angstrom scale. The reasons for this lower thermal transport are implied in the prior section about mean free path in fluids. One form of thermal transport, however, is enhanced which is blackbody radiation. It has been experimentally shown that the Plank limit for blackbody spectral radiance at a given temperature can be exceeded at nanoscale distances. Thus, not only does the magnitude of thermal transport decrease, but the primary type of transport, from conduction/convection to blackbody which is in keeping with the rarefied to vacuum fluid behavior, changes.

Differences in the interactions of fields (an electromagnetic field is the primary intended example here due to its longer wavelengths compared to other possible examples), for the purposes in this discussion, could be further sub-classified as wavelength related and other quantum effects (in particular tunneling). At nanoscales, the behavior of electromagnetic fields between a source (envisioned here as the apex of an AFM tip whether as the primary source or as a modification of a relatively far field source) and a surface will not be subject to wavelength dependent diffraction limitations to resolution that far field sources will experience. This behavior, commonly referred to as the near-field optics, has been used with great success in scanning probe technologies such as near field scanning optical microscopy (NSOM). Beyond applications in metrology, the near field behavior can affect the electromagnetic interaction of all nanoscale sized objects spaced nano-distances from each other. The next near-field behavior mentioned is quantum tunneling where a particle, in particular an electron, can be transported across a barrier it could not classically penetrate. This phenomenon allows for energy transport by a means not seen at macro scales, and is used in scanning tunneling microscopy (STM) and some solid-state electronic devices. Finally, there are more esoteric quantum effects often seen with (but not limited to) electromagnetic fields at nanoscales, such as proximity excitation and sensing of plasmonic resonances, however, it will be appreciated by one skilled in the art that the current discussion gives a sufficient demonstration of the fundamental differences between macro and nano-scale physical processes.

In the following, the term "surface energy" may be used to refer to the thermodynamic properties of surfaces which are available to perform work (in this case, the work of adhesion of debris to the surfaces of the substrate and the tip respectively). One way to classically calculate this is the Gibb's free energy which is given as:

$$G(p,T) = U + pV - TS$$

where:
U=Internal Energy;
p=Pressure;
V=Volume;
T=Temperature; and
S=Entropy.

Since the current practice does not vary pressure, volume, and temperature (although this does not need to be the case since these parameters could equally be manipulated to get the desired effects as well) they will not be discussed in detail. Thus, the only terms being manipulated in the equation above will be internal energy and entropy as driving mechanisms in the methods discussed below. Entropy, since it is intended that the probe tip surface will be cleaner (i.e., no debris or unintended surface contaminates) than the substrate being cleaned is naturally a thermodynamic driving mechanism to preferentially contaminate the tip surface over the substrate (and then subsequently, contaminate the cleaner pallet of soft material). The internal energy is manipulated between the pallet, tip, debris, and substrate surfaces by the thermophysical properties characterized by their respective surface energies. One way to relate the differential surface energy to the Gibbs free energy is to look at theoretical developments for the creep properties of engineering materials at high temperatures (i.e., a significant fraction of their melting point temperature) for a cylinder of radius r, and length l, under uniaxial tension P:

$$dG = -P^*dl + \gamma^*dA$$

where
γ=Surface energy density [J/m2]; and
A=Surface area [m2].

The observation that the stress and extrinsic surface energy of an object are factors in its Gibbs free energy induces one to believe these factors (in addition to the surface energy density γ) could also be manipulated to perform reversible preferential adhesion of the debris to the tip (with respect to the substrate) and then subsequently the soft pallet. Means to do this include applied stress (whether externally or internally applied) and temperature. It should be noted that it is intended that the driving process will always result in a series of surface interactions with a net ΔG<0 in order to provide a differential surface energy gradient to preferentially decontaminate the substrate and subsequently preferentially contaminate the soft pallet. This could be considered analogous to a ball preferentially rolling down an incline to a lower energy state (except that, here, the incline in thermodynamic surface energy also includes the overall disorder in the whole system or entropy). FIG. 6 shows one possible set of surface interactions where the method described here could provide a down-hill thermodynamic Gibbs free energy gradient to selectively remove a contaminate and selectively deposit it on a soft patch. This sequence is one of the theoretical mechanisms thought to be responsible for the current practice aspects using low surface energy fluorocarbon materials with medium to low surface energy tip materials such as diamond.

SUMMARY

At least in view of the above, there is a desire for novel apparatuses and methods for removing debris, particles or anything foreign to the substrate surface, and in particular, novel apparatuses and methods capable of cleaning substrates with high aspect ratio structures, photomask optical proximity correction features, etc., without destroying such structures and/or features on a nanoscale.

According to an aspect of the present disclosure, a system for removing debris from a surface of a substrate is provided. The system includes a cantilever arm and a tip having a proximal portion and a distal portion. The tip is supported by the cantilever arm at the proximal portion of the tip. The system further includes at least one nanofibril extending from the distal portion of the tip, the nanofibril being configured to elastically deform against or around the debris or the surface of the substrate.

There has thus been outlined, rather broadly, certain aspects of the invention in order that the detailed description thereof herein may be better understood, and in order that the present contribution to the art may be better appreciated. There are, of course, additional aspects of the invention that will be described below and which will form the subject matter of the claims appended hereto.

In this respect, before explaining the various aspects of the present disclosure in greater detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. Therefore, that the claims should be regarded as including such equivalent constructions insofar as they do not depart from the spirit and scope of the present disclosure.

DETAILED DESCRIPTION

Figure 1A:
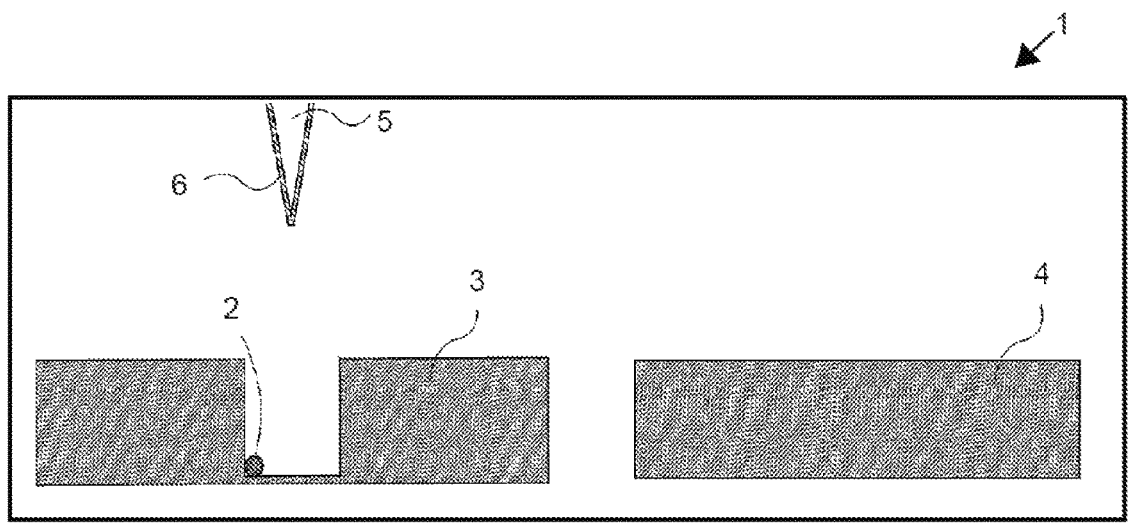
FIGS. 1A to 1C illustrate cross-sectional views of a portion of a debris removal device during a sequence of surface interactions in accordance with aspects of the present disclosure.

The invention will now be described with reference to the drawing figures, in which like reference numerals refer to like parts throughout.

Figure 1B:
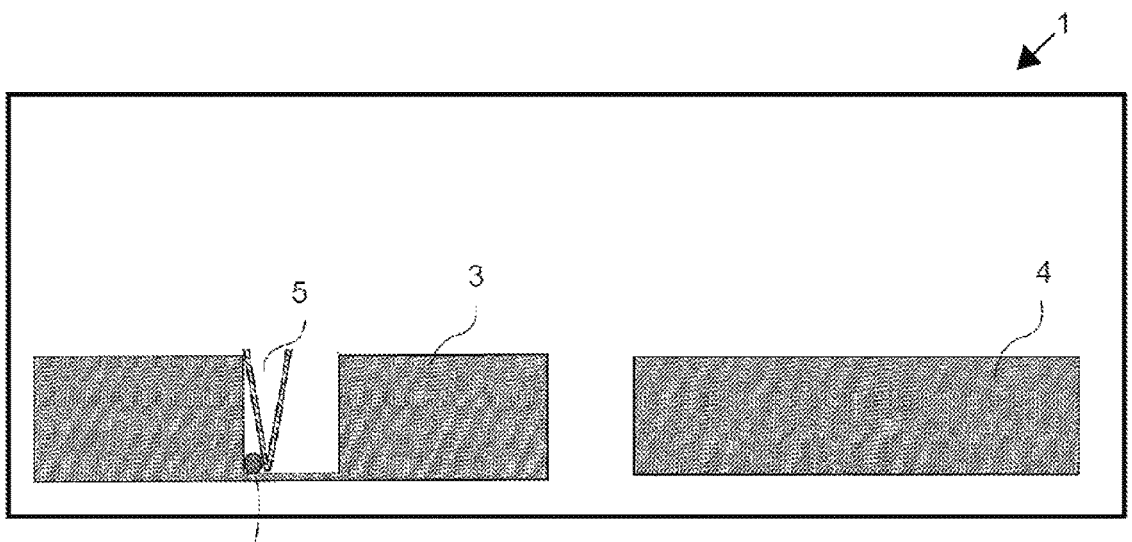
Figure 1C:
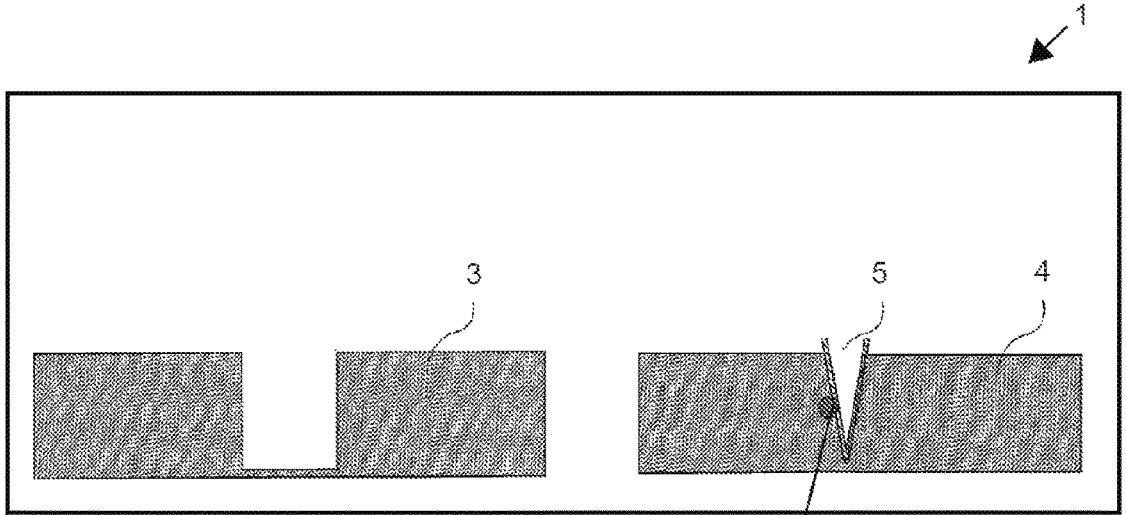

FIGS. 1A to 1C illustrate cross-sectional views of a portion of a debris removal device 1 during a sequence of surface interactions in accordance with aspects of the present disclosure. A potential sequence of surface interactions that could selectively adhere a particle 2 from a substrate 3 and then relocate it to a soft patch 4 is shown in figures (moving from left to right). In FIG. 1A, a particle 2 contaminates a (relatively) high surface energy substrate 3 which decreases its surface energy and increases the entropy in the whole system. Next in FIG. 1B, a tip 5 with a diffusively mobile low surface energy coating is then driven to coat the (once again relatively) higher surface energy substrate 3 and particle 2, debonding them. Subsequently, the depletion of the low surface energy material may have slightly increased the surface energy of the tip 5 (closer to its normal, uncoated value) so that there is an energy gradient to adhere the now de-bonded particle 2 to a surface of the tip 6 (additionally, materials such a fluorocarbons typically have good cohesion). These interactions should also increase the entropy of the system especially if the tip surface 6 is cleaner than the substrate. Finally in FIG. 1C, the particle 2 is mechanically lodged into the soft patch material 4 and this mechanical action also recoats the tip surface 6 with the low surface energy material which should both decrease the energy and increase the entropy of the system.

Figure 2:
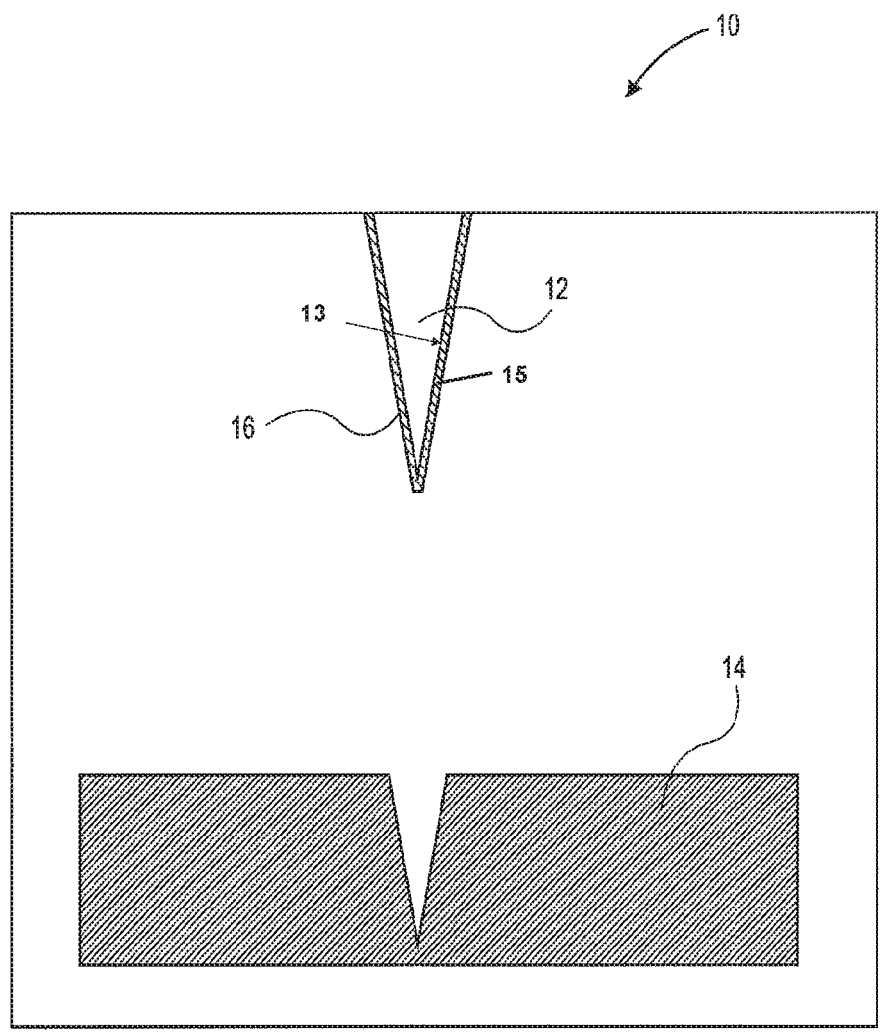
FIG. 2 illustrates a cross-sectional view of a portion of a debris removal device in accordance with aspects of the present disclosure.

FIG. 2 illustrates a cross-sectional view of a portion of a debris removal device 10 according to an embodiment of the present disclosure. The device 10 includes a nanometer-scaled tip 12 positioned adjacent to a patch or reservoir 14 of low surface energy material. The low surface energy material in the reservoir may be solid, liquid, semi-liquid or semi-solid.

Formed on the tip 12 is a coating 16. Before forming the coating 16, tip 12 may be pre-coated or otherwise surface treated to modify the surface energy of the tip 12 (e.g., to modify the capillary, wetting, and/or surface tension effects). When properly selected, the coating 16 allows the tip 12 to remain sharper for a longer period of time than an uncoated tip. For example, a PTFE-coated diamond tip can have a longer operating life than an uncoated diamond tip.

According to certain aspects of the present disclosure, the coating 16 may include the same low surface energy material found in the patch or reservoir of low energy material 14. Also, according to certain aspects of the present disclosure, the tip 12 may be in direct contact with the patch or reservoir of low energy material 14 and the coating 16 may be formed (or replenished) on the surface of tip 12 by rubbing or contacting the tip 12 against the patch or reservoir of low energy material 14. Furthermore, rubbing the tip 12 against the patch or reservoir of low energy material and/or scratching the pad 14 may enhance surface diffusion of the low surface energy material over the surface of tip 12.

According to certain aspects of the present disclosure, the coating 16 and the patch or reservoir of low energy material 14 may both be made from, or at least may include, chlorinated and fluorinated carbon-containing molecules such as Polytetrafluoroethylene (PTFE) or other similar materials such as Fluorinated ethylene propylene (FEP). According to other aspects of the present disclosure, an intermediate layer 15 of metallic material, oxide, metal oxide, or some other high surface energy material may be disposed between the surface of tip 12 and the low-surface energy material coating 16. Some representative examples of the intermediate layer may include, but is not limited to, cesium (Cs), iridium (Ir), and their oxides (as well as chlorides, fluorides, etc.). These two exemplary elemental metals are relatively soft metals with low and high surface energies respectively, and thus they represent the optimization of a surface energy gradient optimal for a given contaminate, substrate, and surrounding environment. Additionally or alternatively, the surface of tip 12 may be roughened or doped. The high surface energy material or tip treatment typically acts to bind the low-surface energy material coating 16 to the tip 12 more strongly. Since the shape of the tip also influences localized surface energy density variations (i.e., nanoscale sharpness will greatly increase surface energy density right at the apex), the shape of the tip may also be modified to provide increased selective adhesion of particles to the tip. Roughening a tip surface 13 of the tip 12 may also provide greater adhesion due to the increase in surface area of contact with the particle and the number of potential binding sites (dA). The tip surface 13 may also be treated (possibly by chemical or plasma processes) so that the tip surface 13 contains highly unstable and chemically active dangling bonds that can react with a particle or some intermediary coating to increase adhesion. The tip surface 13 may also be coated with a high surface area material like high density carbon (HDC) or diamond like carbon (DLC) to increase the surface area of the tip 12 interacting with a particle.

A high-surface energy pre-treatment is used without a low-surface energy coating 16 according to certain aspects of the present disclosure. In such aspects, the particles 20 discussed below may be embedded in some other soft targets (e.g., Au, Al) using similar methods to those discussed herein, or the tip 12 may be a consumable. Also, other physical and/or environmental parameters may be modified (e.g., temperature, pressure, chemistry, humidity) to enhance tip treatment and/or particle pick-up/drop-off as will be appreciated by one skilled in the art in view of the present disclosure.

Figure 3:
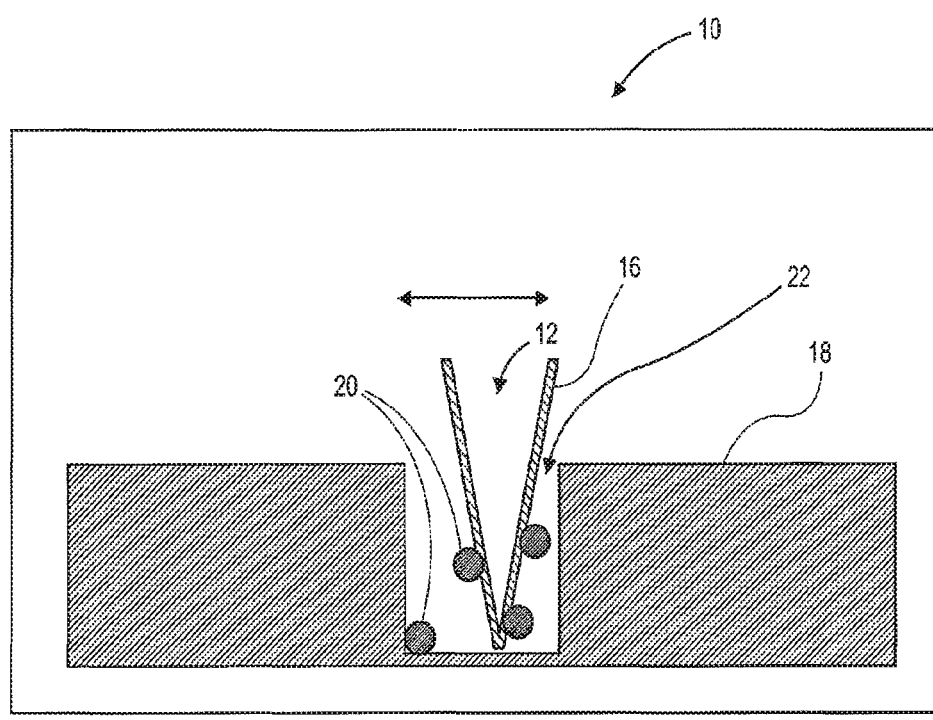
FIG. 3 illustrates a cross-sectional view of another portion of the debris removal device illustrated in FIG. 2.

According to certain aspects of the present disclosure, all of the components illustrated in FIGS. 2 and 3 are included in an AFM. In some such configurations, the patch or reservoir of low energy material 14 is substantially flat and is attached to a stage that supports the substrate 18. Also, according to certain aspects of the present disclosure, the patch or reservoir of low energy material 14 is removable from the stage and may easily be replaced or easily refillable. For example, the patch or reservoir of low energy material 14 may be affixed to the AFM with an easily releasable clamp or magnetic mount (not illustrated).

FIG. 3 illustrates a cross-sectional view of another portion of the debris removal device 10 illustrated in FIG. 2. Illustrated in FIG. 3 is a substrate 18 that may typically be positioned adjacent to the patch or reservoir of low energy material 14 illustrated in FIG. 2. Also illustrated in FIG. 3 is a plurality of particles 20 that may present in a trench 22 that is formed on the surface of the substrate 18. The particles 20 are typically attached to the surfaces of the trench 22 via Van der Waals short-range forces. In FIG. 3, the tip 12 may be moved and positioned adjacent to the substrate 18 to physically attach the particles 20 to the tip 12. In order to reach the bottom of the trench 22, the tip 12 as illustrated in FIGS. 2 and 3 may be a high aspect ratio tip. Although a trench 22 is illustrated in FIG. 3, the particles 20 may be attached to or found on other structures to be cleaned.

Figure 4:
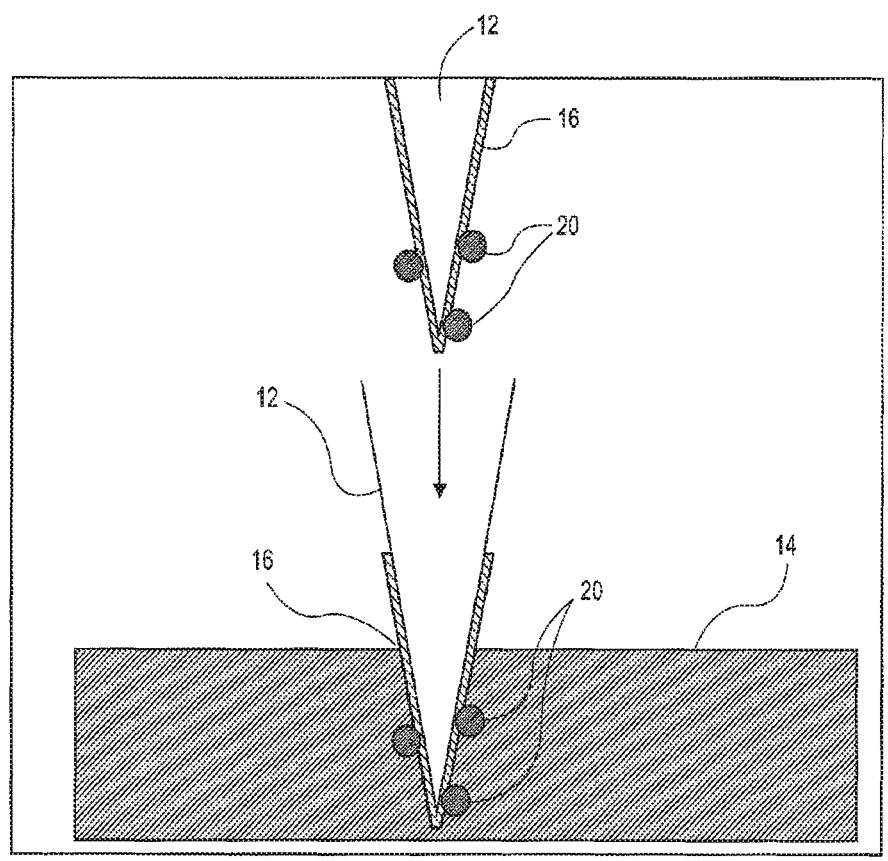
FIG. 4 illustrates a cross-sectional view of the portion of the debris removal device illustrated in FIG. 2, wherein particles are being imbedded in the patch or reservoir of low energy material.
Figure 5:
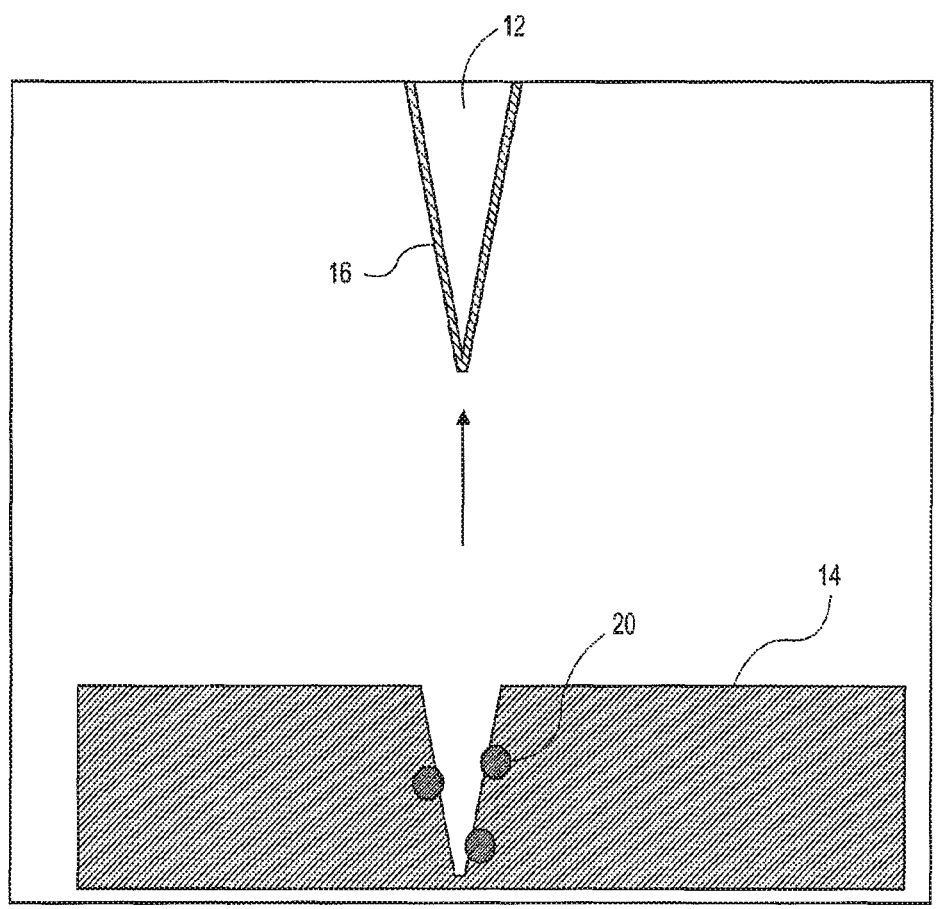
FIG. 5 illustrates a cross-sectional view of the portion of the debris removal device illustrated in FIG. 4, wherein the tip is no longer in contact with the patch or reservoir of low energy material.

FIG. 4 illustrates a cross-sectional view of the portion of the debris removal device 10 illustrated in FIG. 2, wherein the particles 20 may be transferred from the tip 12 and may be imbedded in the patch or reservoir of low energy material 14 by extending the tip 12 into or against a surface of the patch or reservoir of low energy material 14. Subsequently, as shown in the cross-sectional view of FIG. 5, the tip 12 may be retracted such that the tip 12 is no longer in contact with the patch or reservoir of low energy material 14. As the tip 12 is retracted or withdrawn from the patch or reservoir of low energy material 14, the particles 20 previously on the tip 12 remain with the patch or reservoir of low energy material 14.

According to certain aspects of the present disclosure, the device 10 illustrated in FIGS. 2-5 may be utilized to implement a method of debris removal. It should be noted that certain aspects of the present disclosure may be used in conjunction with other particle cleaning processes, either prior or pursuant to the method discussed herein. It should also be noted that, although only one tip 12 is discussed and shown in the figures, a plurality of tips may be used simultaneously to remove particles from multiple structures at the same time. Additionally, a plurality of tips could be used in the methods discussed herein in parallel and at the same time.

The debris method mentioned above may include positioning the tip 12 adjacent to one or more of the particles 20 (i.e., the pieces of debris) illustrated as being on the substrate 18 in FIG. 3. The method may further include physically adhering (as opposed to electrostatically adhering) the particles 20 to the tip 12 as also illustrated in FIG. 3 as well as some possible repetitive motion of the tip 12 when in contact with the particle(s) 20 and surrounding surfaces. Following the physical adherence of the particles 20 to the tip 12, the method may include removing the particles 20 from the substrate 18 by moving and/or withdrawing the tip 12 away from the substrate 18, and moving the tip 12 with the particles 20 to the patch or reservoir of low energy material 14, as illustrated in FIG. 4.

According to certain aspects of the present disclosure, the method may include forming the coating 16 on at least a portion of the tip 12. In certain aspects of the present disclosure, the coating 16 may comprise a coating material that has a lower surface energy than a surface energy of the substrate 18. Additionally or alternatively, the coating 16 may comprise a coating material that has higher surface area than the surface area of the particle 20 that is in contact with the substrate 18.

In addition to the above, some aspects of the method may further include moving the tip 12 to at least a second location of the substrate 18 such that the tip 12 is adjacent to other pieces of particles or debris (not illustrated) such that the other pieces of particles or debris are physically attached to the tip 12. The other pieces of particles debris may then be removed from the substrate 18 by moving the tip 12 away from the substrate 18 in a manner analogous to what is shown in FIG. 4.

Once debris (e.g., the particles 20 discussed above) have been removed from the substrate 18, some methods according to the present disclosure may include a step of depositing the piece of debris in a piece of material positioned away from the substrate (e.g., the above-discussed patch or reservoir of low energy material 14).

Because the tip 12 may be used repeatedly to remove large amounts of debris, according to certain aspects of the present disclosure, the method may include replenishing the coating 16 by plunging the tip 12 in the patch or reservoir of low energy material 14. Low surface energy material from the patch or reservoir of low energy material may coat any holes or gaps that may have developed in the coating 16 of the tip 12 over time. This replenishing may involve one or more of moving the tip 12 laterally within the patch or reservoir of low energy material 14 after plunging the tip 12 into the patch or reservoir of low energy material 14, rubbing a surface of the tip 12, or altering a physical parameter (e.g., temperature) of the tip 12 and/or the patch or reservoir of low energy material 14.

It should be noted that certain methods according to the present disclosure may include exposing a small area around a defect or particle to a low surface energy material before a repair in order to reduce the likelihood that the removed material will lump together and strongly adhere again to the substrate after the repair is completed. For example, a defect/particle and an approximately 1-2 micron area around the defect may be pre-coated with PTFE or FEP according to certain aspects of the present disclosure. In such instances, a tip 12 coated or constructed from a low surface energy material (e.g., a PTFE or FEP tip) can be used to apply a very generous amount of the low surface energy material to a repair area even when other repair tools (laser, e-beam) are being utilized. In addition to the coating 16 on the tip 12, a portion or an entirety of the tip 12 may comprise a low energy material such as, but not limited to, chlorinated and fluorinated carbon-containing molecules. Examples of such materials may include PTFE or FEP. Additionally or alternatively, other materials such as metals and their compounds may be used. Some representative examples include Cs, Ir, and their oxides (as well as chlorides, fluorides, etc.). These two exemplary elemental metals are relatively soft metals with low and high surface energies respectively, and thus they represent the optimization of a surface energy gradient optimal for a given contaminate, substrate, and surrounding environment. Additionally or alternatively, other carbon based compounds may be used. Some representative examples include HDC or DLC.

According to certain aspects of the present disclosure, the method includes using the patch or reservoir of low energy material 14 to push the particles away from an apex of the tip 12 and toward an AFM cantilever arm (not illustrated) that is supporting the tip 12, above the apex. Such pushing up of the particles 20 may free up space near the apex of the tip 12 physically adhere more particles 20.

According to certain aspects of the present disclosure, the tip 12 is used to remove nanomachining debris from high aspect ratio structures such as, for example, the trench 22 of the substrate 18, by alternately, dipping, inserting, and/or indenting the tip 12 into a pallet of soft material which may be found in the patch or reservoir of low energy material 14. In select aspects, the soft material of the patch or reservoir of low energy material 14 may have a doughy or malleable consistency. This soft material may generally have a greater adherence to the tip 12 and/or debris material (e.g., in the particles 20) than to itself. The soft material may also be selected to have polar properties to electrostatically attract the nanomachining debris particles 20 to the tip 12. For example, the patch or reservoir of low energy material 14 may comprise a mobile surfactant.

In addition to the above, according to certain aspects of the present disclosure, the tip 12 may include one or more dielectric surfaces (i.e., electrically insulated surfaces). These surfaces may be rubbed on a similarly dielectric surface in certain environmental conditions (e.g., low humidity) to facilitate particle pick-up due to electrostatic surface charging. Also, according to certain aspects of the present disclosure, the coating 16 may attract particles by some other short-range mechanism, which may include, but is not limited to, hydrogen bonding, chemical reaction, enhanced surface diffusion.

Figure 6:
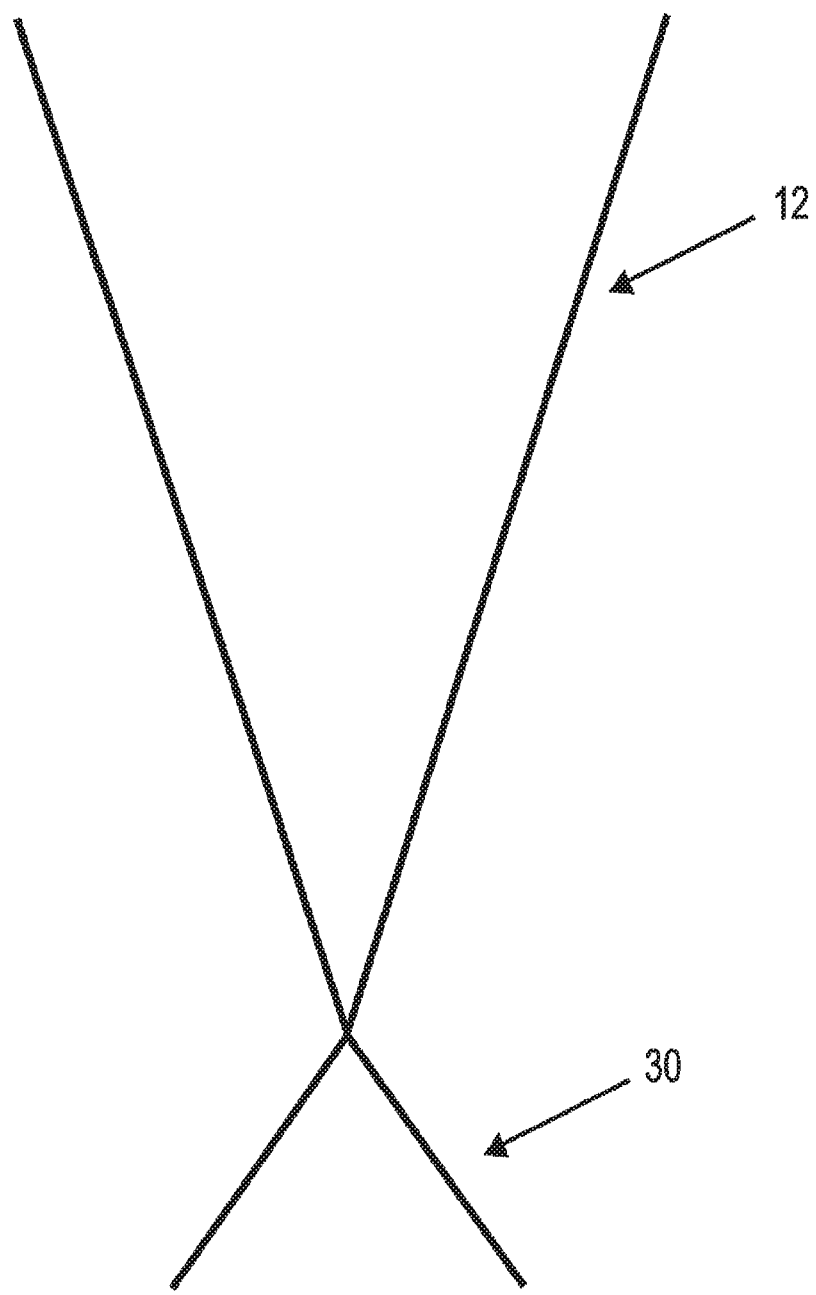
FIG. 6 illustrates a cross-sectional view of a tip with bristles or fibrils in accordance with aspects of the present disclosure.

Any tip that is strong and stiff enough to penetrate (i.e., indent) the soft pallet material of the patch or reservoir of low energy material 14 may be used. Hence, very high aspect tip geometries (greater than 1:1) are within the scope of the present disclosure. Once the tip is stiff enough to penetrate the soft (possibly adhesive) material, high aspect ratio tips that are strong and flexible are generally selected over tips that are weaker and/or less flexible. Hence, according to certain aspects of the present disclosure, the tip can be rubbed into the sides and corners of the repair trench 22 of the substrate 18 without damaging or altering the trench 22 or the substrate 18. A rough macro-scale analogy of this operation is a stiff bristle being moved inside a deep inner diameter. It should also be noted that, according to certain aspects of the present disclosure, the tip 12 may comprise a plurality of rigid or stiff nanofibrils bristles, as will be described in greater detail below. In one aspect as shown in FIG. 6, each bristle of the plurality of rigid or stiff nanofibrils bristles 30 may extended linearly from the tip 12. In one aspect, the plurality of rigid or stiff nanofibrils bristles 30 may be formed with carbon nanotubes, metal whiskers, etc. The tip 12 may additionally or alternatively comprise a plurality of flexible or wrap nanofibrils, as will be described in greater detail below. The plurality of flexible or wrap nanofibrils may be formed on the tip 12 using polymer materials, for example. Other materials and structures are of course contemplated.

According to certain aspects of the present disclosure, the detection of whether or not one or more particles have been picked up may be performed by employing a noncontact AFM scan of the region of interest (ROI) to detect particles. The tip 12 may then be retracted from the substrate 18 without rescanning until after treatment at the target. However, overall mass of debris material picked up by the tip 12 may also be monitored by relative shifts in the tip's resonant frequency. In addition, other dynamics may be used for the same function.

Instead of indenting in a soft material to remove particles 20 as discussed above and as illustrated in FIG. 5, the tip 12 may also be vectored into the patch or reservoir of low energy material 14 to remove the particles 20. As such, if the tip inadvertently picks up a particle 20, the particle 20 can be removed by doing another repair. Particularly when a different material is used for depositing the particles 20 by vectoring, then a soft metal such as a gold foil may be used.

In addition to the above, a ultra-violet (UV)-light-curable material, or similarly some other material susceptible to a chemically nonreversible reaction, may be used to coat the tip 12 and to form the coating 16. Before the UV cure, the material picks up particles 20 from the substrate 18. Once the tip 12 is removed from the substrate 18, the tip 12 may be exposed to a UV source where the material's properties would be changed to make the particles 20 less adherent to the tip 12 and more adherent to the material in the patch or reservoir of low energy material 14, where the particles 20 may subsequently be removed from the tip 12 and deposited with the patch or reservoir of low energy material 14. Other nonreversible process which further enhances, or enables, the selectivity of particle pick up and removal are of course contemplated.

Certain aspects of the present disclosure provide a variety of advantages. For example, certain aspects of the present disclosure allow for active removal of debris from high aspect trench structures using very high aspect AFM tip geometries (greater than 1:1). Also, certain aspects of the present disclosure may be implemented relatively easily by attaching a low surface energy or soft material pallet to an AFM, along with using a very high aspect tip and making relatively minor adjustments to the software repair sequences currently used by AFM operators. In addition, according to certain aspects of the present disclosure, a novel nanomachining tool may be implemented that could be used (like nano-tweezers) to selectively remove particles from the surface of a mask which could not be cleaned by any other method. This may be combined with a more traditional repair where the debris would first be dislodged from the surface with an uncoated tip, then picked up with a coated tip.

Generally, it should be noted that, although a low surface energy material is used in the local clean methods discussed above, other possible variations are also within the scope of the present disclosure. Typically, these variations create a surface energy gradient (i.e., a Gibbs free energy gradient) that attracts the particle 20 to the tip 12 and may be subsequently reversed by some other treatment to release the particles 20 from the tip 12.

Figure 7A:
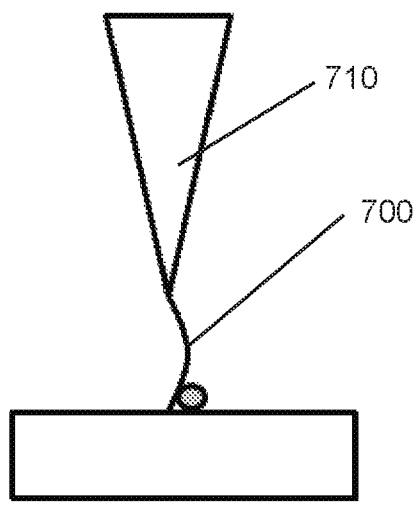
FIGS. 7A and 7B illustrates the general differences between a stiff fibril and a wrap fibril in accordance with aspects of the present disclosure.
Figure 7B:
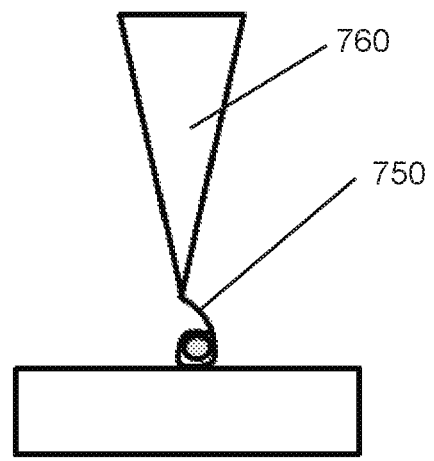

One aspect of the present disclosure involves the attachment of at least one nanofibril to the working end of an AFM tip to provide enhanced capability in high aspect structures while also allowing for less mechanically aggressive process to the underlying substrate. These fibrils can be, according to their mechanical properties and application towards nanoparticle cleaning, classified under two different labels, "stiff" fibrils, and "wrap" fibrils. To understand the differences, FIGS. 7A and 7B illustrate differences between these 2 types of fibrils, the stiff fibril 700 attached to a tip 710 and the wrap fibril 750 attached to a tip 760. Additionally, we must first understand the two critical processes required in BitClean particle cleaning: Dislodgement of the Nanoparticle, Bonding and Extraction of the Nanoparticle from the Contaminated Surface. With these most critical steps defined, the functional differences between the two different fibrils are given as follows.

With reference to FIG. 7A, the stiff fibril 700 relies more on the mechanical action, and mechanical strength, of the fibril itself to dislodge the nanoparticle. Thus, it also relies on the shear and bending strength and moduli of elasticity to accomplish the dislodgement successfully without breaking. This means there are very few materials which could exceed, or even meet, the strength and stiffness (typically referred to as its hardness) of single crystal diamond. Among these are carbon nanotubes and graphene, since both use the carbon-carbon sp3 hybrid orbital interatomic bonds (one of the strongest known) that are also found in diamond. Other contemplated materials include certain phases of boron-containing chemistries which possess properties that could possibly exceed the mechanical strength and stiffness of diamond so these materials could also be used. In general, many materials (including diamond) can become intrinsically stronger and stiffer as their dimensionality is reduced (with stiffness decreasing as the structure approaches atomic scales and its shape is determined by thermal diffusive behaviors). This is a material phenomenon that was first observed in nanocrystalline metals but has also been confirmed in molecular simulation and some experiment to also occur with single crystal nanopillars. One leading hypothesis for this behavior leads into the defect diffusion mechanism of plastic deformation. At larger scales, these crystal defects (vacancies, dislocations, etc.) diffuse and interact in bulk-dominated kinetics. It is believed that at smaller scales (all things being equal such as material and temperature), these defect movements become dominated by surface-diffusion kinetics which are much higher than in the bulk of the crystal. When considered within a material-continuum approximation, this greater surface diffusion rate translates into plastic deformation (also referred to as yield), and even failure, of materials at lower stress levels. For example, with Ti single-crystal nanopillars, the yield stress has been shown to increase with decreasing cross-section width up to a range around 8 to 14 nm (depending, in part, to the direction of the stress and the crystallographic orientation of the nanopillar), below this range, the behavior undergoes an inflection point where the yield stress actually decreases with decreasing cross-section width.

Figures 8A, 8B, 8C:
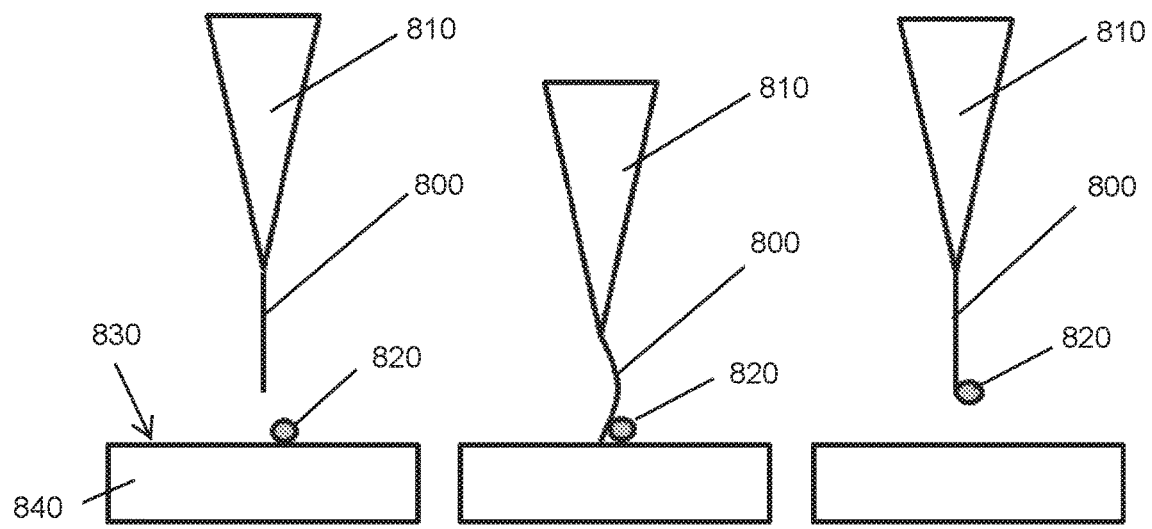
FIGS. 8A to 8C illustrate a process of dislodging and removing a nanoparticle from a target substrate using a single stiff fibril in accordance with aspects of the present disclosure.

FIGS. 8A to 8C illustrate an exemplary process of dislodging and removing a nanoparticle from a target substrate using a single stiff fibril 800 attached at or near the apex of an AFM tip 810. The tip 810 approaches the surface and scans using the same principles as an AFM scan without the stiff fibril. It will be appreciated by one skilled in the art that different operational parameters may be applied in view of the single stiff fibril 800 attached to the apex of the tip 810. Once the particle is located, the tip 810 is moved towards a surface 830 and the stiff fibril 800 is elastically deformed, as generally shown in FIG. 8B. In one aspect, the deformation of the stiff fibril 800 may be compressive, shear, bending, tensile or a combination thereof and can also be used to mechanically dislodge the nanoparticle 820 from the surface 830. Once the nanoparticle 820 is dislodged, the surface energy and area differences between the stiff fibril 800, substrate 840 and nanoparticle 820 surfaces govern whether the nanoparticle 820 adheres to the stiff fibril 800 when it is subsequently extracted from the substrate surface 830.

Figures 9A, 9B, 9C:
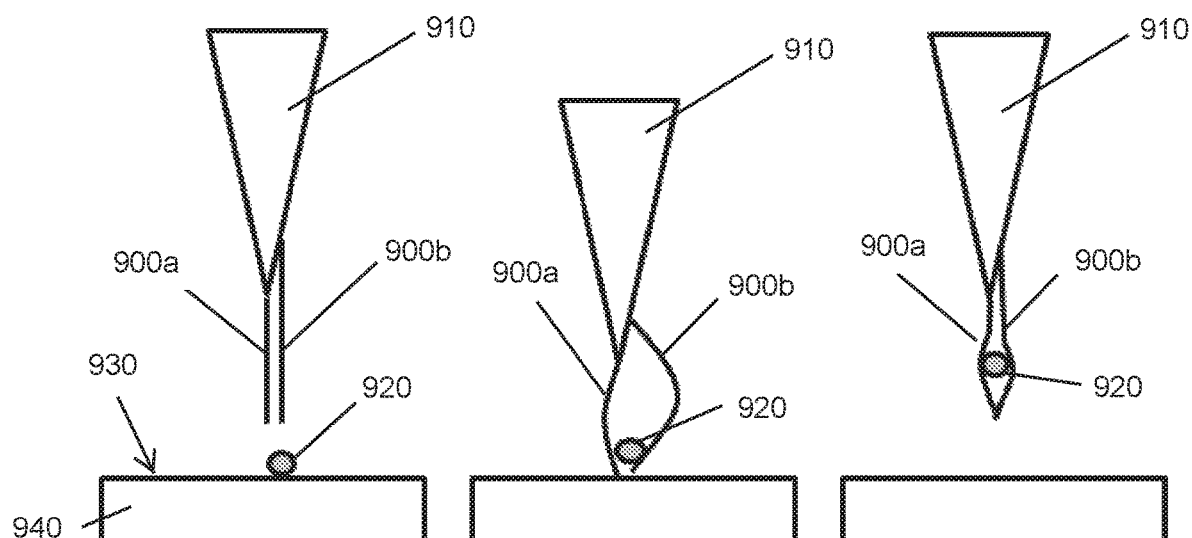
FIGS. 9A to 9C illustrate a process of dislodging and removing a nanoparticle from a target substrate using a plurality of stiff fibrils in accordance with aspects of the present disclosure.

An exception to this, unique to the stiff fibril nanoparticle clean process, is when two or more stiff fibrils are strongly attached to the tip surface at a distance less than the nanoparticle diameter (but not less than the elastic deformation limit for the stiff fibrils as determined by their shear and bending moduli and length to width ratio), as illustrated in FIGS. 9A to 9C. In accordance with aspects where two or more stiff fibrils 900a, 900b are attached to the tip 910 at a distance less than the nanoparticle diameter, the sequence is very similar to the single stiff fibril as discussed above with reference to FIGS. 8A to 8C. The differences starting in the observation that there are more strained or deformed stiff fibrils 900a, 900b around the nanoparticle 920 thus increasing the probability that one or more stiff fibrils 900a, 900b will impact the nanoparticle 920 in just the way (force and angle of applied force) needed to dislodge a nanoparticle 920 for a given cleaning scenario, as generally shown in FIG. 9B. Following the dislodgement step, the multi-fibril tip 910 may have more potential surface area for the particle 920 to adhere (i.e., wet) to. As the tip 910 is retracted from the substrate, as generally shown in FIG. 9C, another difference emerges if the length and spacing of the fibrils are within the correct range. The nanoparticle 920 with this setup has the possibility of becoming mechanically trapped within the spaces between the stiff nanofibrils 900a, 900b, which may result in greater adhesion to the multi-fibril 900a, 900b and a greater probably of extracting the nanoparticle 920 from the substrate surface 930. Similarly, if it is desired to deposit the nanoparticle 920 on another surface, the tip 910 may be re-approached to a surface and the stiff fibrils 900a, 900b again stressed to relax their mechanical entrapment of the nanoparticle 920 thus increasing the probability the nanoparticle 920 will be deposited at the desired surface location. As previously stated, this assumes that the length and spacing of the fibrils 900a, 900b are within the correct range, on the first order model, these ranges include a fibril spacing less than the minimum width of the nanoparticle 920 (assuming a strong nanoparticle that will not crumble), but large enough that the fibrils 900a, 900b will not be bent beyond their shear and bending strength limit (also determined by the relative length of the fibrils and assuming the adhesion strength of the fibril attachment is not less than this limit), as will be appreciated by those skilled in the art in view of the present disclosure. In select aspects, the two or more stiff fibrils may have different and unequal lengths.

To define what a stiff fibril is (as opposed to a wrap fibril), one must be able to define the anisotropic spring constants (related to the effective shear and bending moduli) for a specific material and nano-structure. Since this is very difficult to do in practice, it is assumed for our purposes here that these properties are roughly proportional to the tensile (a.k.a. Young's) elastic modulus and strength. The tensile modulus is a possible measure of the stiffness of a material within the stress range where it exhibits elastic (i.e., spring-like) mechanical properties. It is given as the stress divided by the strain, thus yielding units the same as stress (since stain is defined as deformation ratio of final versus initial dimension). Although it does not specifically define stiffness, tensile strength is also important since the fibril must be able to apply sufficient force to dislodge a nanoparticle without breaking-off itself and creating an additional contamination to the substrate surface. Strength is also given in units of stress (Pascals). For diamond, the intrinsic tensile modulus is on the order of 1.22 terra-Pascals (TPa) with a tensile strength ranging from 8.7 to 16.5 giga-Pascals (GPa) and provides here our general reference measure for stiffness and strength (approaching within the value for tungsten of 0.5 TPa for tensile elastic modulus, or exceeding these values). Since carbon nanotubes are, by their very nature, not intrinsic entities their tensile moduli are specific to the individual molecule and its properties (e.g., Single-walled or Multi-Walled, respectively SWNT or MWNT, chirality, etc.). For SWNT's, their tensile elastic modulus can range from 1 to 5 TPa with its tensile strength ranging from 13 to 53 GPa. For comparison with another class of materials in this range, $B_xN_y$ (boron nitride compounds of various stoichiometry) has a tensile elastic modulus which ranges from 0.4 to 0.9 TPa. For the purpose of distinguishing and defining the boundary between a wrap fibril from a stiff fibril, the standard mechanical material property most relevant and applicable is the yield stress. A stiff fibril is defined here as any material with a yield stress greater than or equal to 0.5 GPa (1 GPa=$1 \times 10^9$ N/m$^2$). Thus, by elimination, any material with a yield stress less than 0.5 GPa would be considered a wrap fibril. It should be noted that, especially at nanoscales, many materials can exhibit anisotropic mechanical properties so it is important that the yield stress is specified for shear stresses (or equivalent bending stresses) transverse to the fibril's major (i.e., longest) dimension.

A wrap fibril, in contrast to a stiff fibril, will have much lower spring constants (specified here as elastic tensile moduli) with sufficiently high (comparable) tensile strength. In the case of the wrap fibrils, due to the differences in how it is applied, the tensile strength is directly related to its performance since a tensile force is applied to both dislodge and extract the nanoparticle from the substrate surface. However, it should be noted, that most mechanical properties quoted in the literature are for the bulk material which should, in principle, be almost completely unrelated to the tensile properties for mono-molecular fibrils (or nano-scale fibrils approaching mono-molecular scales). For example, PTFE, is typically quoted to have very low tensile elastic modulus and strength in the bulk material (0.5 GPa and may be <<20 MPa respectively), but since the molecule's backbone is comprised of carbon-carbon sp-hybrid orbital chemical bonds, its mono-molecular tensile strength should be more comparable to diamond than many other materials, C-nanotubes, and graphene (all of which contain the same kind of chemical bonds). Since the bulk material mechanical properties is more related to the action of single-molecule strands interacting with their neighbors, it should be more comparable to both the cohesive and mono-molecular bending and shear moduli. Since these types of materials (polymers) exemplify the mechanical properties associated with plastic deformation, their molecules are expected to deform according to more diffusive-thermal behaviors which exhibit high flexibility. If the macroscopic allegory for the stiff fibril is a sliver of glass, the comparable allegory for the wrap fibril would be thin carbon fibers (the latter can appear highly flexible at macro scales with high tensile strength).

Figures 10A, 10B, 10C:
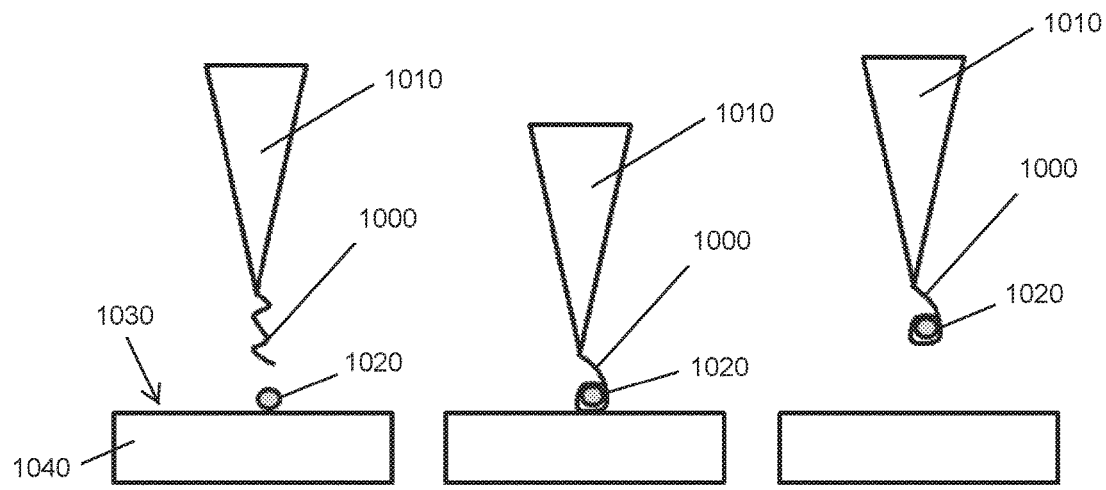
FIGS. 10A to 10C illustrate a process of removing a nanoparticle from a target substrate using a single wrap fibril in accordance with aspects of the present disclosure.

FIGS. 10A to 10C show a nanoparticle cleaning sequence using a wrap (flexible) nanofibril 1000 attached to an AFM tip 1010 near or at the apex, in accordance with an aspect of the present disclosure. Since there is no compression stress required to deform the wrap-type fibril 1000, the tip 1010 is brought into close proximity to the surface 1030 in order to bring the fibril 1000 into close enough proximity to the nanoparticle surface for short range surface energy forces to allow for the fibril 1000 to adhere to it. Since the relative surface energies of the fibril 1000, nanoparticle 1020, and substrate surfaces 1030 are targeted so that the fibril would preferentially adhere to the nanoparticle surface, once the fibril 1000 is brought into contact with enough slack given the fibril length, only time and applied agitation energies (possibly mechanical and/or thermal) are required to allow the fibril 1000 to wrap around the particle 1020. It is possible that mechanical energies (whether by the tip 1010 with the fibrils 1000 attached, or another tip in a prior processing pass) from a more rigid tip could be applied to initially dislodge the particle 120. Once the fibril 1000 is sufficiently wrapped-around the nanoparticle 1020, as generally shown in FIG. 10B, the tip 1010 is then extracted from the substrate surface 1030. During this phase, if the adhesion of the fibrils 1000 to the nanoparticle 1020 (enhanced the more it is wrapped and entangled around the nanoparticle), the tensile strength of the fibril 1000, and its adhesion to the AFM tip 1010 are all greater than the adhesion of the nanoparticle 1020 to the substrate 1040, then the nanoparticle 1020 will be extracted from the substrate 1040 with the tip 1010, as generally shown in FIG. 10C.

Figures 11A, 11B, 11C, 11D:
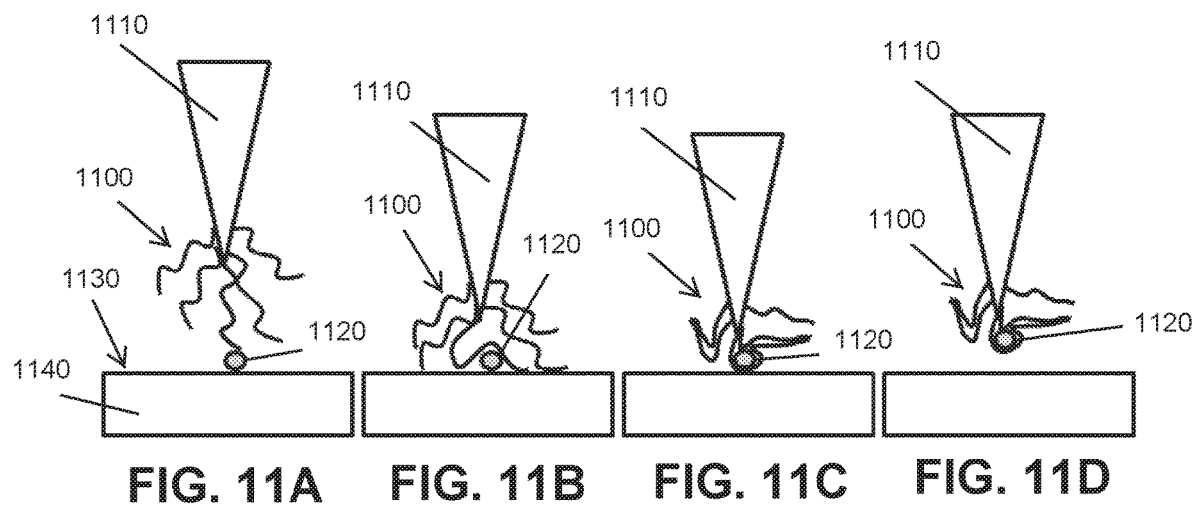
FIGS. 11A to 11D illustrate e process of removing a nanoparticle from a target substrate using a DNA-Origami functionalized wrap fibrils in accordance with aspects of the present disclosure.

Some examples of possible materials that may be used to make wrap nano (or molecular) scale fibrils include: RNA/DNA, Actin, amyloid nanostructures, and lonomers. RNA (ribonucleic acid) and DNA (deoxyribonucleic acid) are described together since they represent similar chemistries, preparation, and handling processes. Recently, significant progress has been made with the technology known colloquially as, "DNA-Origami", which allows for the precise chemical engineering of how DNA molecules link together. It is believed that similar processes, applied to these or similar chemistries, could allow for long polymer chain molecules to detach and link-together on queue. Given the most common process, specific DNA sequences would be chemically produced, or obtained commercially from well-known single-stranded viral DNA sequences, and a properly chemically-functionalized (such as is done in Chemical Force Microscopy practices) AFM tip 1110 is immersed in the aqueous solution, or placed in AFM-contact to a surface, containing the DNA sequences so that the latter bind as designed. The tip 1110 may then be functionalized for particle removal from a substrate surface 1130, as shown in FIGS. 11A to 11D. Moving from left to right in the figures, the functionalized tip 1110 may be moved or actuated to approach near (closer than the length of the DNA strands 1100) the particle 1120 and substrate surfaces 1130, as shown in FIG. 11A. A higher temperature may be applied (possibly ~90° C.) with an activating chemistry (either helper DNA strands, also available commercially, or some other ionic activator such as a magnesium salt) while the tip 1110 is near the dislodged particle 1120 as shown in FIG. 11B. The environment may then cooled (possibly to ~20° C.) allowing the targeted sequences in the strands 1100 to link up as shown in FIG. 11C (the linking strands 1100 are at the opposite free ends of the molecules). Once the DNA coating 1100 has solidified to the point where the nanoparticle 1120 is securely attached, the tip 1110 may then be extracted from the substrate surface 1130 as shown in FIG. 11D. At these small scales, it is possible to describe this bonding between the nanoparticle and the tip to be mechanical, however if the particle is on the molecular scale, it could also be described as a steric bond. Steric effects may be created by atomic repulsion at close enough proximity. If an atom or molecule is surrounded by atoms in all possible diffusion directions, it will be effectively trapped and unable to chemically of physically interact with any other atoms or molecules in its environment. RNA can similarly be manipulated as will be appreciated by those skilled in the art in view of the present disclosure The next possible wrap nano-fibril candidate is a family of similar globular multi-function proteins that forms filaments in eukaryotic cells, one of which is known as actin. Actin is used inside cells for scaffolding, anchoring, mechanical supports, and binding, which would indicate it is a highly adaptable and sufficiently strong protein filament. It would be applied and used in methods very similar to the DNA-origami related process discussed above. Experiments indicate that this protein can be crystalized to a molecule of dimensions of 6.7×4.0×3.7 nm.

Research into the mechanisms in which certain marine organisms (barnacles, algae, marine flatworms, etc.) can strongly bond to a large range of substrate materials biomimetically (or directly) provides another wrap fibril candidate. These marine organisms secrete a substance, commonly referred to by the acronym DOPA (3,4-dihydroxyphenylalanine), which bonds to these substrate surfaces with functional amyloid nanostructures. The adhesive properties of amyloid molecules are due to (3-strands that are oriented perpendicular to the fibril axis and connected through a dense hydrogen-bonding network. This network results in supramolecular (3-sheets that often extend continuously over thousands of molecular units. Fibrillar nanostructures like this have several advantages including: underwater adhesion, tolerance to environmental deterioration, self-healing from self-polymerization, and large fibril surface areas. As previously discussed, large fibril surface areas enhance adhesion by increasing the contact area in the adhesive plaques of barnacles. Amyloid nanostructures also have possible mechanical advantages such as cohesive strength associated with the generic amyloid intermolecular (3-sheet structure and adhesive strength related to adhesive residues external to the amyloid core. These properties make amyloid structures a basis for a promising new generation of bio-inspired adhesives for a wide range of applications. Advances in the use of molecular self-assembly have allowed for the creation of synthetic amyloid and amyloid-analogue adhesives for nanotechnological applications although a fully rational design has not yet been demonstrated experimentally, in part, due to limits in understanding of the underlying biological design principles.

The final example of a wrap fibril material is a class of polymers known as ionomers. In brief, these are long thermoplastic polymer molecules that strongly bind at targeted ionic charged sites along the molecular chain. A common example of an ionomer chemistry is poly(ethylene-co-methacrylic acid). According to one aspect of the present disclosure, the ionomer may be functionalized to the surface of a scanning thermal probe. The process for cleaning a nanoparticle would then be very similar to that shown for the DNA-origami process discussed above except that an aqueous environment would not necessarily be required especially when used with the scanning thermal probe. An ionomer functionalization coating may also be paired with an ionic surfactant for preferential conjugate bonding within an aqueous (or similar solvent) environment. It should be mentioned that these examples (especially DNA/RNA and actin) are highly biocompatible for removal and manipulation of nano-particulate entities inside living structures such as cells.

For example, one variation that may be used includes using a high surface energy tip coating. Another variation includes pretreating the particles with a low surface energy material to debond the particles and then contacting the particles with a high surface energy tip coating (sometimes on a different tip). Still another variation includes making use of a chemical energy gradient that corresponds to a chemical reaction occurring between a tip surface coating and the particle surface to bond the two. This may either be performed until a tip is exhausted or reversed with some other treatment.

According to still other aspects of the present disclosure, adhesives or sticky coatings are used in combination with one or more of the above-listed factors. Also, the surface roughness or small scale (e.g., nanometer-scale) texture can be engineered to maximize particle clean process efficiency.

In addition to the above, mechanical bonding may be used, typically when the tip 12 includes fibrils that, analogously to a mop, are capable of mechanically entangling the particles 20. The mechanical entanglement, according to certain aspects of the present disclosure, is driven by and/or enhanced by surface energy or chemical changes with contact or environment.

According to still other aspects of the present disclosure, the tip 12 may be coated with molecular tweezers (i.e., molecular clips). These tweezers may comprise noncyclic compounds with open cavities capable of binding guests (e.g., the above-discussed particles 20). The open cavity of the tweezers typically binds guests using non-covalent bonding including hydrogen bonding, metal coordination, hydrophobic forces, van der Waals forces, π-π interactions, and/or electrostatic effects. These tweezers are sometimes analogous to macrocyclic molecular receptors except that the two arms that bind the guest molecules are typically only connected at one end.

In addition to the above, the particles 20 may be removed by the tip using diffusion bonding or Casmir effects. Also, as in the aspects of the present illustrated in FIG. 6, bristles or fibrils 30 can be attached to the end of the tip 12. Whether strategically or randomly placed, these bristles or fibrils 30 can enhance local clean in several ways. For example, an associated increase in surface area may be used for surface (short range) bonding to the particles.

According to some of aspects of the present disclosure, fibrils 30 are engineered to be molecules that selectively (e.g., by either surface or environment) coil around and entangle a particle 20, thus maximizing surface contact. Also, dislodging of the particles 20 occurs according to certain aspects of the present disclosure, typically when stiff bristles 30 are attached to the tip 12. However, fibrils 30 may also entangle a particle 20 and dislodge the particle 20 mechanically by pulling on the particle 20. In contrast, relatively rigid bristles 30 typically allow the tip 12 to extend into hard-to-reach crevices. Then, by impact deformation stress of the bristles 30, by surface-modification of the tip 12 to repel particles 20, or by some combination, the particle 20 is dislodged. In addition, certain aspects of the present disclosure mechanically bond the particles 20 to the tip 12. When fibrils are on the tip 12, entanglement of one or more of either the whole or frayed fibrils may occur. When bristles are on the tip 12, the particle 20 may be wedged between (elastically) stressed bristles.

According to still other aspects of the present disclosure, methods of debris removal include changing the environment to facilitate local clean. For example, gas or liquid media may be introduced or the chemistry and/or physical properties (e.g., pressure, temperature, and humidity) may be changed.

In addition to the components discussed above, certain aspects of the present disclosure include an image recognition system that identifies debris to be removed. As such, an automatic debris-removal device is also within the scope of the present disclosure.

According to certain aspects of the present disclosure, a relatively soft cleaning tip is used to avoid unwanted damage to inside contours, walls, and/or bottom of a complex shape. When appropriate, a stronger force is used to bring the relatively soft tip into much stronger contact with the surface while also increasing the scan speed.

It should also be noted that a tip exposed to and/or coated with a low surface energy material may be used for other purposes besides removing debris (cleaning) of nanometer level structures. For example, such tips can also be used, according to certain aspects of the present disclosure, to periodically lubricate micron level or smaller devices (like MEMS/NEMS) to contain chemical reactions.

This method may be performed in a variety of environments according to the requirements of the application and to further enhance differential adhesion of the particle from the substrate surface to the patch or reservoir of low energy material. These environments may include, but are not limited to, vacuum, shield gasses of various composition and pressure, and fluids of variable composition (including fluids with varying ionic strengths and/or pHs).

Since there are many other factors influencing the Gibbs free energy gradients between the substrate, tip, debris, and soft patch, these other factors may also be manipulated to create a down-hill gradient to move particles from the substrate to the soft patch. One factor is temperature. It would be possible to use a scanning thermal probe in conjunction with temperature of the substrate and soft patch material to create a desired gradient. The fundamental equation for Gibbs free energy indicates that if the debris is successively contacted by surfaces of greater relative temperature (since the T*S term is negative in the equation) may provide a possible driving force of ΔG<0. From the equation for ΔG of a deformed rod under high temperature, we can also see another factor is stress applied to the tip would potentially increase debris adhesion. This could be accomplished by external hardware (i.e., biomaterial strips with different coefficients of thermal expansion) or by compression or shear with the substrate below the threshold for nanomachining or tip breakage. The deformation of the tip material may also provide a mechanism of mechanical entrapment of the debris especially if it is roughened (or covered in nano-bristles) and/or if it has a high microstructural defect (i.e., void) density at the surface. The final factor that will be discussed will be chemical potential energy. It is possible to modify the chemical state of the tip and/or soft patch surfaces to create preferential chemical reactions to bond the debris material to the tip. These chemical bonds may be covalent or ionic in nature (with the sp3-hybid orbital covalent bond being the strongest). The debris may be coated with one component of a targeted lock-and-key chemically bonding pair of chemistries. The tip (or another tip) may be coated with the other chemical and brought in contact with the debris surface to bond it to the tip. One non-limiting example of a lock-and-key pair of chemistries is streptavidin and biotin which is often used in Chemical Force Microscopy (CFM) experiments. Another example using an ionic bond would be two surfactant polar molecular chemistries where the exposed polar ends of the molecules on the debris and tip surface are of opposite charge. There are additional related aspects to the surface chemical interaction adhesion mechanisms including depleted solvation and steric-interacting coatings or surfaces. Chemical changes to the tip surface would also allow for targeted changes to its surface energy as well as phase changes (in particular from fluid to solid) that may surround (to maximize surface area dA) and mechanically entrap the debris at the tip surface in order to bond it. These chemical changes (whether to the tip material surface or some intermediary coating) may be catalyzed by external energy sources such as heat (temperature), ultraviolet light, and charged particle beams.

The many features and advantages of the invention are apparent from the detailed specification, and thus, it is intended by the appended claims to cover all such features and advantages of the invention which fall within the true spirit and scope of the invention. Further, since numerous modifications and variations will be readily apparent to those skilled in the art in view of the present disclosure, it is not desired to limit the invention to the exact construction and operation illustrated and described, and accordingly, all suitable modifications and equivalents may be resorted to, falling within the scope of the invention.

What is claimed is:

1. A system configured to remove debris from a surface of a substrate, comprising:
    an image recognition system to identify the debris to be removed;
    a cantilever arm;
    a tip having a proximal portion and a distal portion, the tip being supported by the cantilever arm at the proximal portion of the tip,
    wherein a plurality of nanofibrils extend from the distal portion of the tip, one or more of the nanofibrils being configured to elastically deform against or around the debris or the surface of the substrate and further configured to mechanically entangle particles,
    wherein at least one of the nanofibrils is a wrap fibril having a yield stress of less than 0.5 GPa,
    wherein the wrap fibril is configured to coil around and entangle of coiling around and entangling the debris, and mechanically dislodge the debris, and
    a material in which the removed debris is deposited.

2. The system of claim 1, wherein the system is further configured to remove the debris from a nanomachined surface of the substrate.

3. The system of claim 1, wherein the system is further configured to remove the debris from a surface of a photolithography mask or a semiconductor substrate/wafer.

4. The system of claim 1, wherein the system is further configured to remove the debris from a surface of a membrane, pellicle film, a micro-electronic mechanical system (MEMS), or a nano-electronic mechanical system (NEMS).

5. The system of claim 1, wherein at least one of the nanobrils is a stiff fibril and has a yield stress of greater than or equal to 0.5 GPa.

6. The system of claim 1, wherein the wrap fibril is made of one or more of deoxyribonucleic acid, ribonucleic acid, actin, amyloid nanostructures, and ionomers.

7. The system of claim 1, wherein the wrap fibril is formed by immersing at least a portion of the tip in an aqueous solution, or placing at least the portion of the tip in contact with a surface containing deoxyribonucleic acid.

8. The system of claim 1, wherein the debris wherein the debris comprises a plurality of nanoparticles.

9. The system of claim 1, wherein the nanofibrils include at least two stiff fibrils, the at least two stiff fibrils being attached to the tip such that the two stiff fibril are spaced apart at a distance less than a diameter of the debris.

10. The system of claim 9, wherein the at least two stiff fibrils have a yield stress of greater than or equal to 0.5 GPa.

11. The system of claim 10, wherein the at least two stiff fibrils have unequal lengths.

12. The system of claim 1, wherein the nanofibrils include at least two wrap fibrils, the at least two wrap fibrils being configured to wrap around at least one nanoparticle.

13. The system of claim 12, wherein the at least two wrap fibrils have a yield stress of less than 0.5 GPa.

14. The system of claim 1, wherein the tip is coated with molecular tweezers, the molecular tweezers comprising non-cyclic compounds with open cavities configured to bind the debris.

15. The system of claim 14, wherein the coated tip is configured to bind the debris via one or more of non-covalent bonding, metal coordination, hydrophobic forces, van der Waals forces, 7C-7C interactions, and electrostatic effects.

16. The system of claim 1, wherein the nanofibrils comprise a combination of both stiff and wrap fibrils.

17. The system of claim 1, wherein the surface of the tip includes a dielectric surface.

18. The system of claim 1, wherein the tip comprises diamond.

19. The system of claim 1, wherein the tip comprises a polytetrafluoroethylene coating.

* * * * *